United States Patent
Kim et al.

(10) Patent No.: US 7,199,358 B2
(45) Date of Patent: Apr. 3, 2007

(54) ANTENNA-COUPLED MICROBOLOMETER

(75) Inventors: Seong-Hwoon Kim, Ocoee, FL (US);
Richard A. Leblanc, Clermont, FL (US); Lee A. Mirth, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 93 days.

(21) Appl. No.: 10/525,074

(22) PCT Filed: Aug. 20, 2003

(86) PCT No.: PCT/US03/25878

§ 371 (c)(1),
(2), (4) Date: Feb. 18, 2005

(87) PCT Pub. No.: WO2004/018982

PCT Pub. Date: Mar. 4, 2004

(65) Prior Publication Data

US 2005/0264454 A1 Dec. 1, 2005

Related U.S. Application Data

(60) Provisional application No. 60/404,391, filed on Aug. 20, 2002.

(51) Int. Cl.
*H01J 7/24* (2006.01)

(52) U.S. Cl. .................................. 250/238; 250/214 R

(58) Field of Classification Search ................ 250/238, 250/214 R, 214.1; 343/850; 505/847–849
See application file for complete search history.

(56) References Cited

U.S. PATENT DOCUMENTS 5,123,039 A * 6/1992 Shoulders .................... 378/119
6,329,649 B1 12/2001 Jack et al.

* cited by examiner

*Primary Examiner*—Que T. Le
(74) *Attorney, Agent, or Firm*—Buchanan Ingersoll & Rooney PC

(57) ABSTRACT

An antenna-coupled microbolometer multilayer structure, and associated method of forming an antenna-coupled microbolometer multilayer structure are disclosed, where the structure includes a dielectric layer of dielectric material having at least one locally doped region doped with a dopant to provide a thermal conductive path from a first side to a second side of the dielectric layer. The structure includes an antenna on the first side of the dielectric layer coupled to the locally doped region; a read-out integrated circuit (ROIC) on the second side of the dielectric layer coupled to the locally doped region; a conductive substrate between the dielectric layer and the ROIC; and an electrical connection between the locally doped region and the ROIC, wherein the ROIC is connected to detect, via the electrical connection, a change in electrical resistivity of the locally doped region due to thermal energy absorbed from the antenna.

16 Claims, 1 Drawing Sheet

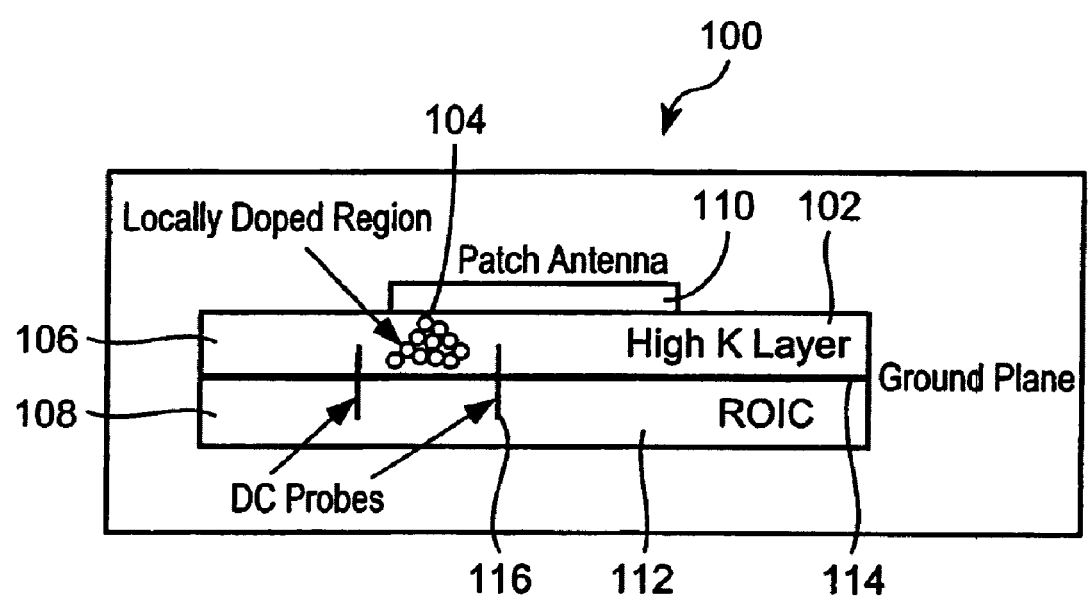
THE FIGURE

ANTENNA-COUPLED MICROBOLOMETER

BACKGROUND

1. Field

The present invention is directed to microbolometers.

2. Background Information

Microbolometers, such as antenna coupled microbolometers, can couple energy to a thermal load at an antenna feedpoint. However, detector hardware used, for example, for millimeter waves in conjunction with an antenna coupled microbolometer, can involve complicated circuitry shielded from the environment. In addition, thermally sensitive material of the microbolometer can be inefficient due to difficulty in controlling the thermal path.

Passive gigahertz (GHz) radiometers have been used with standing optics and low noise amplifier (LNA) based detectors. Known topologies include radiometers having a dipole antenna formed as a printed circuit antenna. However, the topology involves thermal time constant requirement constraints, and a low yield process (suspended structure). Such a topology also involves a complicated read-out integrated circuit (ROIC) interface.

SUMMARY

The present invention is directed to an antenna-coupled microbolometer multilayer structure, and associated method of forming an antenna-coupled microbolometer multilayer structure, where the structure comprises: a dielectric layer of dielectric material having at least one locally doped region doped with a dopant to provide a thermal conductive path from a first side to a second side of the dielectric layer; an antenna on the first side of the dielectric layer coupled to the locally doped region; a read-out integrated circuit (ROIC) on the second side of the dielectric layer coupled to the locally doped region; a conductive substrate between the dielectric layer and the ROIC; and an electrical connection between the locally doped region and the ROIC, wherein the ROIC is connected to detect, via the electrical connection, a change in electrical resistivity of the locally doped region due to thermal energy absorbed from the antenna.

BRIEF DESCRIPTION OF THE DRAWINGS

Other objects and advantages will become apparent to those skilled in the art upon reading the following detailed description of preferred embodiments, in conjunction with the accompanying drawings, wherein like reference numerals have been used to designate like elements, and wherein:

The FIGURE shows an exemplary antenna-coupled microbolometer structure.

DETAILED DESCRIPTION OF THE PREFERRED EMBODIMENTS

An antenna-coupled microbolometer structure is shown in FIG. 1. The exemplary structure 100 includes a dielectric layer 102 of a dielectric material, such as a high permittivity (high K) material having at least one locally doped region 104 doped with a dopant to provide a thermal conductive path from a first side 106 to a second side 108 of the layer 102. An antenna 110 is located on the first side 106 of the dielectric material and is coupled to the locally doped region 104. The antenna 110 is a single antenna or an array of antenna elements (e.g., such as antenna elements suitable for formation on a printed circuit board). The antenna array can be of any size suitable to provide a desired scene size (e.g., 64×64; 128×128; 256×256; 512×512 or other desired regular or irregular (e.g., 64 width by 32 length) array sizes. The coupling can be any suitable coupling that allows the transmission of thermal energy. For example, thermal paste can be used to couple the antenna to the locally doped region.

A read-out integrated circuit (ROIC) 112 is located on the second side 108 of the layer 102 and is coupled to the locally doped region 104. The ROIC can be any suitable known integrated circuit array of one or more detectors suitable to receive a charge for detecting a change in resistivity. For example, a ROIC can be configured with multiple cells from which the detected change in resistivity can be read. An exemplary ROIC used to accumulate charge and produce a readout can be similar to those used in uncooled infrared imagers to measure resistance. For example, the ROIC can generate a known test current (or a known test voltage) which is sequentially (or in parallel) applied to subdivisions of the dielectric layer as defined by the DC probes. The resistance of each such subdivision can be monitored in the ROIC by measuring the voltage across (or current through) each such region. An exemplary readout circuit is disclosed in U.S. Pat. No. 6,465,785. The microbolometer can be formed with a dopant selected such that resistance either increases or decreases with changes in temperature. A conductive substrate 114 is located between the dielectric layer 102 and the ROIC 112. An electrical connection or connections represented as one or more DC probes 116, is located between the locally doped region 104 and the ROIC 112.

The ROIC, via the electrical connection 116, can detect a change in electrical resistivity of the locally doped region 104 as a result of thermal energy absorbed from the antenna 110. For example, the electrical connection can be a collection of electrical probes inserted into the material layer and electrically coupled to the ROIC. The insertion points for these electrical probes can be any desired boundaries of the locally doped region from which a change in resistivity signal is to be detected. For example, the locally doped region coupled to the antenna can be subdivided by the insertion of electrical probes to any desired array size, e.g., a width/height of 64×64, 128×128, 256×256, 512×512, or other regular or irregular (e.g., 64×32) array sizes. The ROIC can be sized proportionately with respect to the antenna (e.g., for a 64×64 antenna array, a 64×64 array of detectors can be used). However, those skilled in the art will appreciate that any size ROIC can be used with any antenna array provided appropriate interfacing is included (e.g., a suitable multiplexer).

The dielectric material can be any suitable dielectric material that converts radio frequency (RF) losses into heat. The heat absorbed by the dielectric material causes a change in resistivity within the locally doped region. Thus, the use of the electrical connection between the locally doped region and the ROIC permits a changing electrical resistivity within each locally doped region to be detected by the ROIC via the electrical connection. Any suitable dielectric material can be used. In an exemplary embodiment, the dielectric material is of relatively high permittivity, for example having a permittivity on the order (e.g., within ± an order of magnitude) of that associated with barium strontium titanate (BaSrTi). However, those skilled in the art will appreciate that any other suitable dielectric material having a permittivity sufficiently high as to be suitable for permitting a thermally induced change in resistivity to be detected in accordance herewith, to a desired degree of accuracy and resolution, can be used.

Any suitable dopant can be utilized. For example, the dopant can be any material that provides a desired (e.g., relatively high, or definable) thermal conductive path in the selected dielectric material. Countervailing considerations include an approximate match between the coefficients of thermal expansion of the dielectric material and the dopant. Further, the thermal path through the dielectric material can be a function of the doping geometry and the dopant selected. For example, the doping geometry can have a gradient within the dielectric material that can enhance the thermal conductivity in a particular direction or between a designated position on the first surface of the dielectric material layer and a designated position on the second surface of the dielectric material layer. In an exemplary embodiment, the dopant can be silicon carbide (SiC), or any other suitable dopant material. The dopant can be selected to be at least partially lattice matched to the dielectric material and can, for example, be interstitial or substitutional.

In exemplary embodiments, the antenna is a patch antenna having a desired frequency, bandwidth and polarization. Further, the antenna-coupled microbolometer structure can be a multilayer structure in which the elements are integrated along a common axis (e.g., vertically integrated). In other embodiments, the elements of the microbolometer structure can be planar oriented, and/or any suitable antenna can be used.

Various methods can be used for forming the antenna coupled microbolometer structure. An exemplary method comprises depositing a dielectric layer of a dielectric material on a first side of a conductive substrate, forming a locally doped region in the dielectric layer of dielectric material, removing at least a portion of the conductive substrate and the dielectric layer, placing electrical probes in proximity to the locally doped region, thermally coupling an antenna (e.g., single antenna or antenna array) to the dielectric material, and electrically coupling a ROIC to the electrical probes.

In exemplary embodiments, removing at least a portion of the conductive substrate can be by any suitable removal method. For example, removing can be by laser ablation, etching, or chemical or physical processes. Likewise, the electrical probes can be formed by any suitable forming method. For example, metallization methods, as are known in the semiconductor industry, are suitable. In alternative embodiments, forming can be by etching or otherwise removing material in the locally doped region to form trenches or vias and inserting electrically conductive wires.

In an exemplary method, the antenna-coupled microbolometer multilayer structure is formed in a buildup process. Accordingly, a substrate, a dielectric material, and electrical connections can be formed in a unitary process using deposition and etch techniques, such as those suitable for semiconductor manufacturing.

Exemplary embodiments of a microbolometer can convert electromagnetic energy into a detectable change in temperature using, for example, an array of antenna elements printed on a high permittivity lossy substrate. This can reduce the physical size of the antenna element and can provide a predictable thermal path with or without an environmental (e.g., electromagnetic interference) package.

According to exemplary embodiments, electromagnetic energy can be collected using the antenna, with energy coupled from the antenna being converted to heat energy in the lossy substrate. The temperature increase in the substrate can be detected by measuring a change in DC resistance of the substrate. Consequently, a robust and efficient thermal path which is part of the temperature measurement system can be provided. Higher dielectric substrates can be used to support smaller antenna elements, thereby freeing up space for support electronics and/or multi-frequency configurations.

Exemplary embodiments can be used in conjunction with concealed weapons detection, standoff explosives detection, and passive radio frequency (RF) sensors. The use of a millimeter wave infrared (mmW\IR) microbolometer can provide a low-cost sensor solution for the aforementioned applications. The increased sensitivity and decreased cost of a passive millimeter wave detection sensor configured in accordance with exemplary embodiments can be suitable for any form of security monitoring and/or missile seekers. A robust structure in accordance with exemplary embodiments, can reduce costs and increase reliability, with material properties tailored to meet application specific requirements.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An antenna-coupled microbolometer multilayer structure comprising:
   a dielectric layer of dielectric material having at least one locally doped region doped with a dopant to provide a thermal conductive path from a first side to a second side of the dielectric layer;
   an antenna on the first side of the dielectric layer coupled to the locally doped region;
   a read-out integrated circuit (ROIC) on the second side of the dielectric layer coupled to the locally doped region;
   a conductive substrate between the dielectric layer and the ROIC; and
   an electrical connection between the locally doped region and the ROIC, wherein the ROIC is connected to detect, via the electrical connection, a change in electrical resistivity of the locally doped region due to thermal energy absorbed from the antenna.

2. The structure of claim 1, wherein the dielectric material is barium strontium titanate.

3. The structure of claim 1, wherein the dopant is silicon carbide.

4. The structure of claim 1, wherein the dopant is lattice matched to the dielectric material.

5. The structure of claim 1, wherein the antenna is a patch antenna.

6. The structure of claim 1, wherein the dielectric layer, the antenna, the ROIC, and the substrate are integrated along a common axis.

7. The structure of claim 2, wherein the dopant is silicon carbide.

8. The structure of claim 7, wherein the dielectric layer, the antenna, the ROIC, and the substrate are integrated along a common axis.

9. A method of forming an antenna-coupled microbolometer multilayer structure, the method comprising:
   depositing a layer of a dielectric material on a first side of a conductive substrate;
   forming a locally doped region in the layer of dielectric material;

removing at least a portion of the conductive substrate and the layer;

placing electrical probes in proximity to the locally doped region;

thermally coupling an antenna to the dielectric material; and electrically coupling a read-out integrated circuit (ROIC) to the electrical probes.

10. The method of claim 9, wherein removing includes use of laser ablation, etching, chemical or physical removal techniques.

11. The method of claim 9, wherein the electrical probes as formed by using metallization techniques or by inserting electrically conductive wires.

12. A method of forming the antenna-coupled microbolometer multilayer structure of claim 9, comprising:

a series of deposition and etch processes in which the dielectric layer of dielectric material is deposited on a first side of a conductive substrate, at least a portion of the conductive substrate and the dielectric layer is removed, and electrical probes correlating to the locally doped region of the dielectric material layer are formed.

13. The method of claim 12, wherein the method is performed in a unitary process in a reaction chamber.

14. The method of claim 12, comprising thermally coupling an antenna to the dielectric material and electrically coupling a ROIC to the electrical probes.

15. The method of claim 12, wherein the dielectric material possesses a high permittivity.

16. The method of claim 15, wherein the dielectric material is barium strontium titanate and the dopant is silicon carbide.

* * * * *